(12) United States Patent
Kelber et al.

(10) Patent No.: US 9,324,938 B2
(45) Date of Patent: Apr. 26, 2016

(54) BORON CARBIDE FILMS EXHIBITS EXTRAORDINARY MAGNETOCONDUCTANCE AND DEVICES BASED THEREON

(71) Applicant: QUANTUM DEVICES, LLC, Potomac, MD (US)

(72) Inventors: Jeffry Kelber, Denton, TX (US); Peter Dowben, Lincoln, NE (US)

(73) Assignee: UNIVERSITY OF NORTH TEXAS, Denton, TX (US)

( * ) Notice: Subject to any disclaimer, the term of this patent is extended or adjusted under 35 U.S.C. 154(b) by 182 days.

(21) Appl. No.: 14/098,759

(22) Filed: Dec. 6, 2013

(65) Prior Publication Data

US 2014/0203382 A1    Jul. 24, 2014

Related U.S. Application Data

(60) Provisional application No. 61/737,907, filed on Dec. 17, 2012.

(51) Int. Cl.
*H01L 43/10* (2006.01)
*H01L 43/08* (2006.01)

(52) U.S. Cl.
CPC ............. *H01L 43/10* (2013.01); *H01L 43/08* (2013.01)

(58) Field of Classification Search
None
See application file for complete search history.

(56) References Cited

U.S. PATENT DOCUMENTS

2010/0224912 A1* 9/2010 Singh et al. .......... 257/201
2013/0233368 A1* 9/2013 Dowben .............. 136/205
2014/0217375 A1* 8/2014 Dowben et al. ........ 257/40

OTHER PUBLICATIONS

Dowben, P., Kizilkaya, O., Liu, J., Montag, B., Nelson, K., Sabirianov, I., Brand, J., Mat. Let. 63 (2009), 72-74.*
Lukaszew, R., Sheng, Y., Uher, C., and Clarke, R., App. Phys. Let., v75(13), 1999, 1941-1943.*
Derwent Abstract of WO 2012/170330 A1 (published 2012).*
S. Hwang, K. Yang, P.A. Dowben, A.A. Ahmad, N.J. Ianno, J.Z. Li, J.Y. Lin, H.X. Jiang, D.N. McIlroy, Appl. Phys. Lett. 70 (1997) 1028.
S. Behera, J. Wilks, P.A. Dowben, J.A. Kelber, Surf. Sci. 604 (2010) L51.
H. Konno, K. Shiba, Y. Kaburagi, Y. Hishiyama, M. Inagaki, Carbon 39 (2001) 1731.
Y. Hishiyama, Y. Kaburagi, K. and Sugihara, Mol. Crystals and Liq. Crystals Sci. and Techn. Section A 340 (2000) 337.
R.S. Singh, x. Wang, W. Chen, Ariando, A.T.S. Wee, Appl. Phys. Lett. 101 (2012) 183105.
P.A. Dowben, O. Kizikaya, J. Liu, B. Montag, K. Nelson, I. Sabirianov, J.I. Brand, Mat. Lett. 63 (2009) 72.
G. Luo, J. Lu, J. Liu, W. Mein, P.A. Dowben, Mat. Sci. and Eng. B 175 (2010) 1.

(Continued)

*Primary Examiner* — Kevin Bernatz
(74) *Attorney, Agent, or Firm* — Steven B. Kelber; The Kelber Law Group

(57) ABSTRACT

Boron carbide polymers prepared from orthocarborane icosahedra cross-linked with a moiety A wherein A is selected from the group consisting of benzene, pyridine. 1,4-diaminobenzene and mixtures thereof give positive magnetoresistance effects of 30%-80% at room temperature. The novel polymers may be doped with transitional metals to improve electronic and spin performance. These polymers may be deposited by any of a variety of techniques, and may be used in a wide variety of devices including magnetic tunnel junctions, spin-memristors and non-local spin valves.

6 Claims, 7 Drawing Sheets

(56) References Cited

OTHER PUBLICATIONS

S. Lee, J. Mazurowski, G. Ramseyer, P.A. Dowben, J. Appl. Phys. 72 (1992) 4925.
D. Byun, B.R. Spady, N.J. Ianno, P.A. Dowben, Nanstruct. Mat. 5 (1995) 465.
F.K. Perkins, R.A. Rosenberg, S. Lee, P.A. Dowben, J. Appl. Phys. 69 (1991) 4103.
F. Pasquale and J. Kelber, Appl. Surf. Sci. 258 (2012) 2639.
F. Pasquale L, J. Liu, P.A. Dowben, J.A. Kelber, Mat. Chem. and Phys. 133 (2012) 901.
P.A. Dowben, D. LaGraffe, D. Li, A. Miller, L. Zhang, L. Dottl, M. Onellion, Phys. Rev. B 43 (1991) 3171.
L. Bernard, J. Monson, A. Sokolov, Z. Liu, C.-. Yang, P.A. Dowben, B. Doudin, A. Harken, P. Welsch, B.W. Robetson, Appl. Phys. Lett. 83 (2003) 3743.
J. Liu, G. Luo, W. Mei, O. Kizilkaya, E.D. Shepherd, J.I. Brand, P.A. Dowben, J. Phys. D.s D: Appl. Phys. 43 (2010) 085403.

* cited by examiner

[1]Pasquale et al. Appl. Surf. Sci. 258 (2012) 2639.
[2]Pasquale et al. Mater. Chem. Phys. 133 (2012) 901.

● = boron   ● = carbon   ● = hydrogen

Structures for $B_{10}C_2H_x$ (top) and $B_{10}C_2H_x$:DAB (bottom)

US 9,324,938 B2

BORON CARBIDE FILMS EXHIBITS EXTRAORDINARY MAGNETOCONDUCTANCE AND DEVICES BASED THEREON

PRIORITY DATA AND INCORPORATION BY REFERENCE

This application claims benefit of priority to U.S. Provisional Patent Application No. 61/737,907 filed Dec. 17, 2012 which is incorporated by reference in its entirety. This application is related to Patent Cooperation Treaty Patent Application PCT/US12/40681 designating the Unite States of America and filed on Jun. 4, 2012. That application in turn claims benefit of the filing date of U.S. Provisional Patent Application No. 61/494,610 filed Jun. 8, 2011. Applicants rely on the disclosures of both the Provisional and PCT Application herein, and both are incorporated by reference herein in their entirety.

This invention was made with government support under contract HDTRA-1-09-1-0060 awarded by the Defense Threat Reduction Agency. The government has certain rights in the invention.

BACKGROUND OF THE INVENTION

PCT Application PCT/US12/40681 discloses the formation of boron carbide films formed by inserting 1,4-diaminobenzene (DAB) between linking units—$B_{10}C_2H_x$. As set forth in that application, these films are of interest in the fabrication of boron carbide alloy films for a wide variety of devices, including devices properly grouped into the field of spintronics and logic devices. In particular, high performance magnetic switches and junctions, and high performance electronic devices such as transistors and the like can be made at relatively low temperatures and conditions consistent with CMOS Si fabrication conditions and the like, if semi-conducting films or boron carbide can be provided with sufficient conductivity.

In PCT Application No. PCT/US12/40681 the boron carbide films are exemplified as provided by co-condensation of ortho-carborane and 1,4-diaminobenzene. In the alternative, other deposition techniques, including Plasma Vapor Deposition, Chemical Vapor Deposition and Plasma Enhanced Chemical Vapor Deposition (PCD, CVD and PECVD, respectively) can be used to deposit these alloy films. Surprisingly, it has been discovered that under the application of a magnetic field, boron carbide films of this type exhibit large increases in conductivity at room temperature.

SUMMARY OF THE INVENTION

We have recently observed positive transverse magnetoconductance (an increase in conductivity with applied magnetic field) at 300 K in boron carbide films formed by cross-linking $B_{10}C_2H_{12}$ icosahedra: $B_{10}C_2H_x$. We have more recently observed even larger positive magnetoconductance at room temperature in a boron carbide polymer formed by inserting 1,4-diaminobenzed (DAB) between linking units—$B_{10}C_2H_x$. Magnetoconductance (MC) as used here is defined by the following equation:

$$MC = [C_H - C_0]/C_0 \qquad (1)$$

where $C_H(C_0)$ is the conductivity in the presence (absence) of an applied magnetic field H. $B_{10}C_2H_x$ films are amorphous, air-stable and can be deposited by PECVD or PVD, ideal for industrial applications. They can be p- or n-doped.[1,2].

Figure 1:
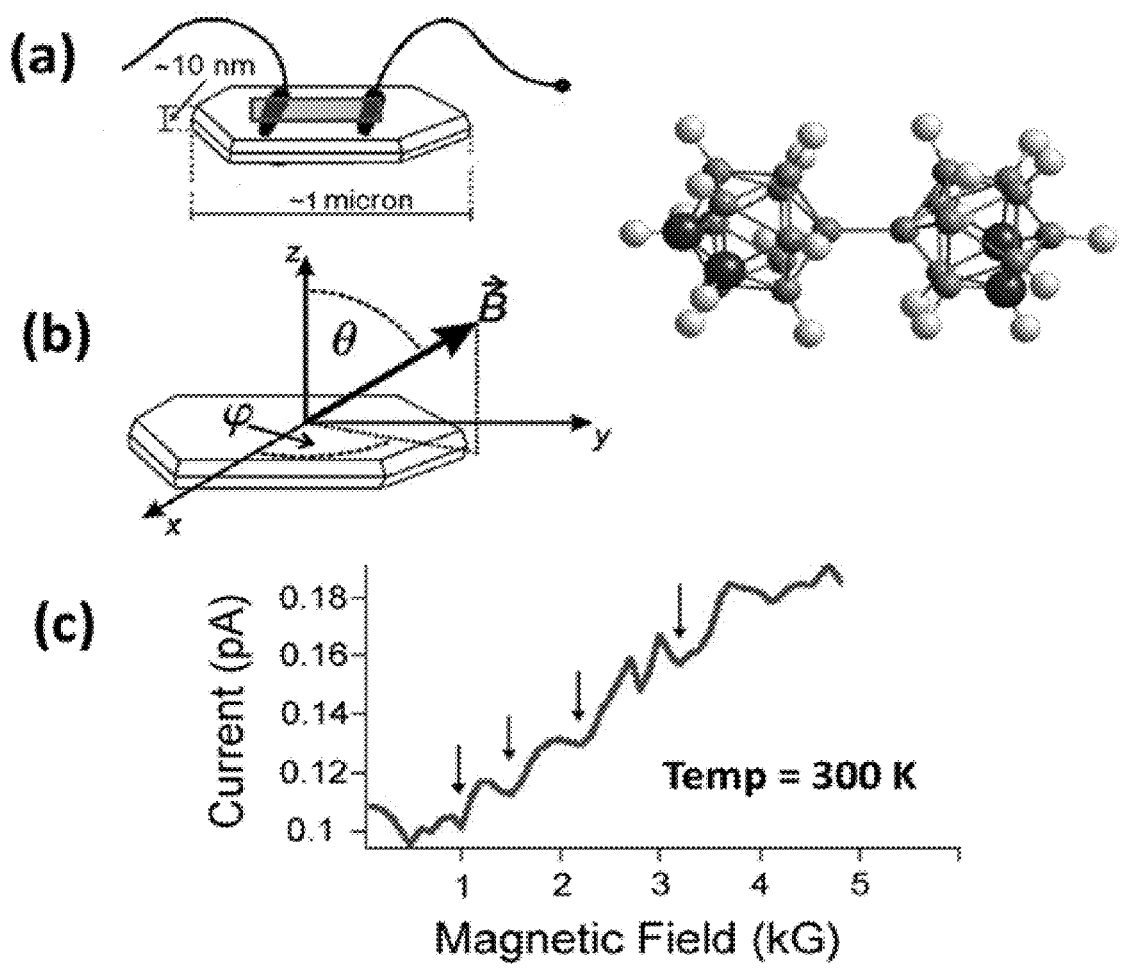
FIG. 1 illustrates extraordinary magnetoresistance (transverse magnetoconductance) of $B_{10}C_2H_x$: (a) schematic of film formed by condensation/cross-linking on patterned substrate; (b) schematic of measurements taken in applied magnetic field (B); (c) magnetoresistance data acquired at 300 K. Inset/right: model of $B_{10}C_2H_x$ repeat unit, with two icosahedra cross-linked at B.

Magnetoconductance results for $B_{10}C_2H_x$ are shown in FIG. 1. These results are exciting because: (1) MC values for B-doped carbon materials are typically an order of magnitude smaller, and observed only near 4.2 K[3,4]. The observation of large-scale effects at or above 300 K suggests device-worthy applications, and a fundamentally new physical phenomenon.

These results are also of interest in that HOPG and graphene exhibit negative magnetoconductance (as defined by eq. 1) [5]. Thus, the positive effect seen here arises from inherent film characteristics, rather than graphitic inclusions. This permits the fabrication of an array of devices compatible with current fabrication conditions for Si CMOS and Si analog devices. Fabrication of magnetic spin valves or spin-FETs and logic devices on a scalable level with ease of integration is made possible.

Figure 2:
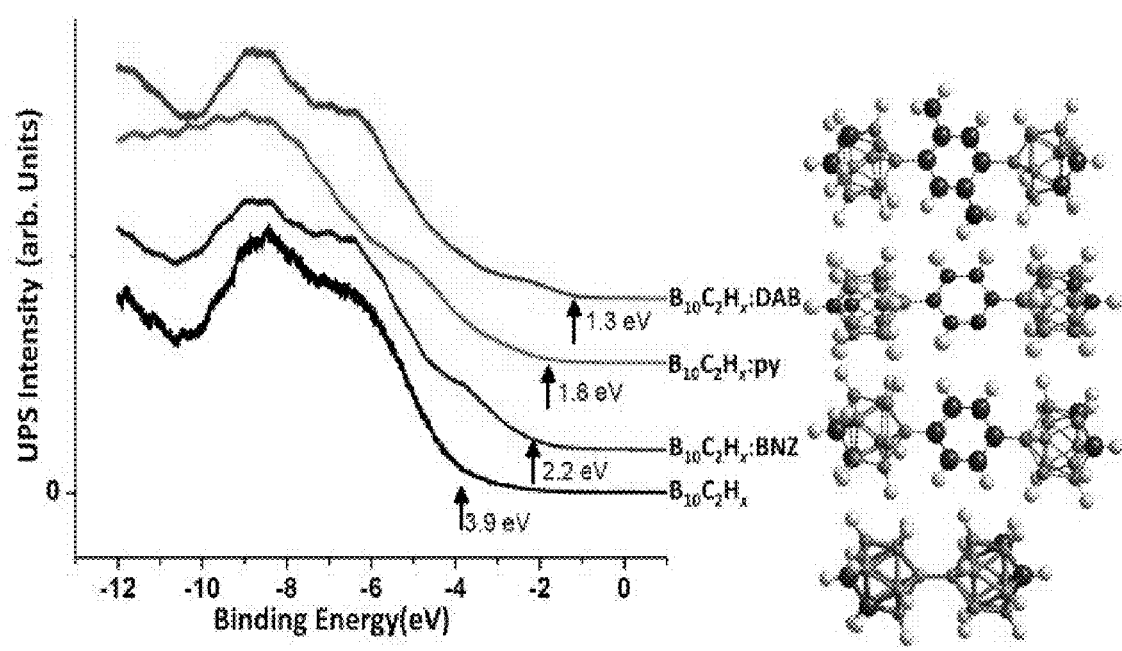
FIG. 2 illustrates valence band densities for boron carbide-based polymers with different linking units on the left. At the right. Corresponding structural models are provided, based on high-resolution core level XPS and DFT calculations.

The recent development, as set forth in PCT Application No. PCT/US12/40681, of a series of boron carbide polymers with linking units between the icosahedra—$B_{10}C_2H_x$:Y; Y=benzene, pyridine, or 1,4-diaminobenzene. These polymers afford a systematic "tuning" of the valence band maximum (VBM) from −3.9 eV to −1.3 eV relative to the Fermi level (see FIG. 2). These afford a way to probe the effects of varying band gap on magnetoresistance and other relevant properties via chemical tuning.

Additionally we have been successful in doping boron carbides with small levels of various transition metals. [6,7]. NEXAFS has identified such substitutions as occurring pairwise at carbon sites of the icosahedra, affording novel opportunities for interaction with the boron carbide-based magnetoconductance phenomenon, and the possibility of spin filtering. Luo et al, supra.

Thus, this fundamentally new and frankly startling observation of extraordinary large positive MC in $B_{10}C_2H_x$ and related systems coincides with the capability to systematically vary the electronic and chemical structures of these materials in a fashion which is both relevant to advanced electronic/spintronic devices, and practical for industrial fabrication practices. This extraordinary supermagnetoconductance at and above room temperature appears confined to the copolymer films prepared by inserting (cocondensing) benzene or benzene derivatives like 1,4-diaminobenzne with orthocarborane, providing new and specific opportunities to provide enhanced devices and materials taking advantage of these properties. This advance makes possible the near term scalable manufacture of high performance magnetic tunnel junctions, non-local spin valves and spin-FETs, and the like.

DETAILED DESCRIPTION OF THE INVENTION

Herein we present our recent, surprising findings and proposed device taking advantage of the anomalously large room temperature magnetoresistance in semiconducting boron carbide, $(B_{10}C_2H_x)$ and in a novel polymer in which the orthocarborane icosahedra are cross-linked with 1,4-diaminobenzene ($B_{10}C_2H_x$:DAB). Magnetoresistance hysteresis is also observed in $B_{10}C_2H_x$:DAB, indicating non-volatile memory/logic applications. As noted, these findings are of significant interest because:

The magnetoresistance effects (30%-80%) are more than an order of magnitude larger than commonly observed for boron-doped materials.

The effect is observed at room temperature, rather than at 4.2 K, as is observed for most materials.

The finding of room temperature hysteresis in the magnetoresistance for $B_{10}C_2H_x$: DAB is highly unusual, if not unprecedented.

These materials are amorphous in nature, not epitaxial. They can be deposited by various methods, including PECVD, and etched by $NH_3$ plasma. They are therefore readily manufacturable and can be integrated at various levels within a device.

Figure 3:
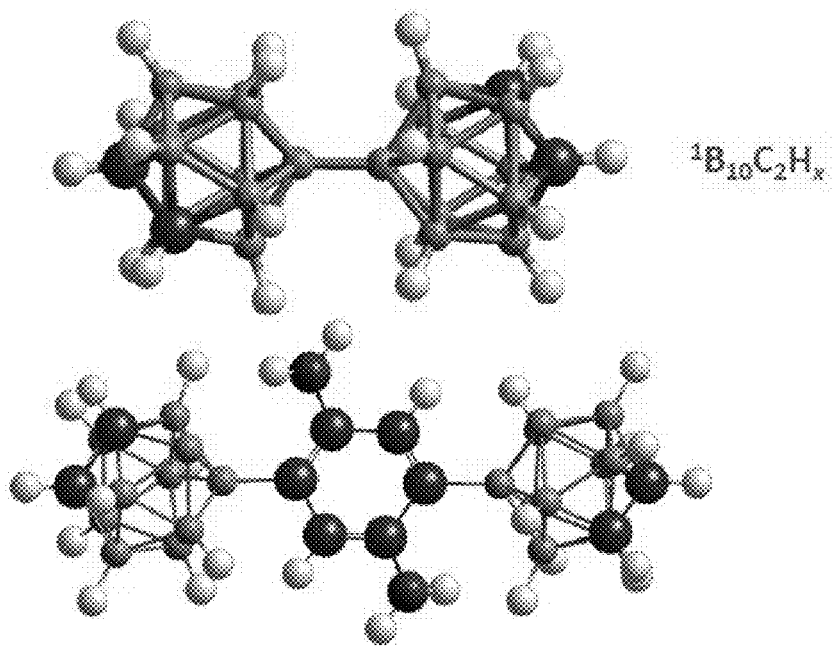
FIG. 3 illustrates the conventional structures for, and differences between, $B_{10}C_2H_x$ and the polymer films of the invention, $B_{10}C_2H_x$:DAB.
Figure 4:
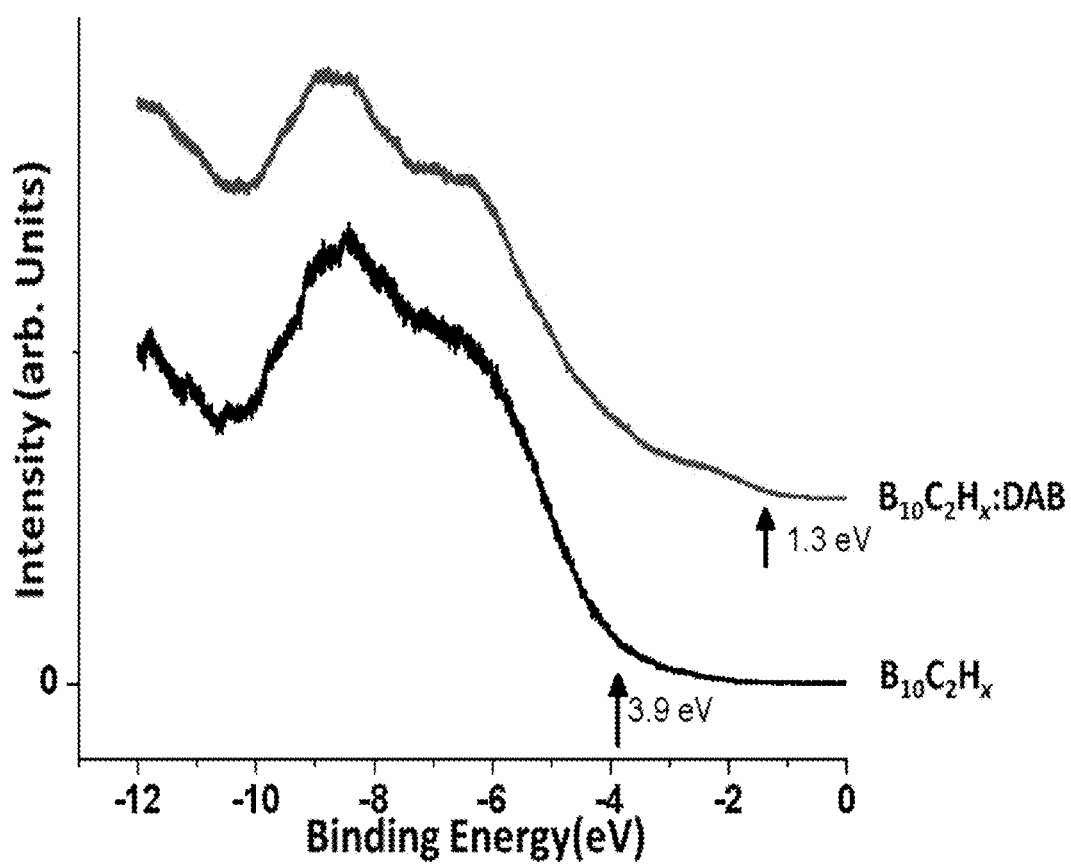
FIG. 4 provides a graph illustration of the valence band photoemission (He I source) for $B_{10}C_2H_x$ (bottom trace) and $B_{10}C_2H_x$:DAB. Arrows mark the valence band maxima relative to the Fermi level. Data indicate a narrower band gap for $B_{10}C_2H_x$:DAB, with states near the top of the VB from the DAB unit (see ref 5).

$B_{10}C_2H_x$ (FIG. 3 top) can be formed from plasma[8,9], photon[10] or e-beam-induced [11] cross linking of carborane ($B_{10}C_2H_{12}$) icosahedra. $B_{10}C_2H_x$:DAB (FIG. 3 bottom) has been formed by ebeam-induced cross-linking of orthocarborane and 1,4 diaminobenzene [12]. Structures of $B_{10}C_2H_x$ and of $B_{10}C_2H_x$: DAB, shown in FIG. 3, are derived from photoemission and DFT calculations. Valence band photoemission data [17], showing that the two materials have different valence band densities of states and band gaps, are shown in FIG. 4.[13]. Benzene and pyridine may be used in place of 1,4-diaminobenzene, as may similar resonance compounds.

As shown in FIG. 4, the $B_{10}C_2H_x$:DAB material exhibits a narrowed band gap, with the states near the top of the valence band derived from the DAB moiety [12]. These data show that for $B_{10}C_2H_x$:DAB, states near the top of the valence band are associated with DAB moieties, indicating that states at the bottom of the conduction band are associated with carborane moieties, allowing for enhanced electron-hole separation. This characteristic may be related to the unusual magnetoresistance hysteresis exhibited by $B_{10}C_2H_x$:DAB (see below.)

Magnetoresistance Results

Room temperature magnetoresistance data were acquired by first depositing either $B_{10}C_2H_x$ or $B_{10}C_2H_x$:DAB thin films (~100 Å thick) on permalloy patterned contacts deposited on $SiO_2$ substrates. Films were deposited at UNT. Contacts were fabricated and magnetoresistance data acquired at UNL. Magnetoresistance data are shown in FIG. 5 for $B_{10}C_2H_x$, and in FIG. 6 for $B_{10}C_2H_x$:DAB.

Figure 5:
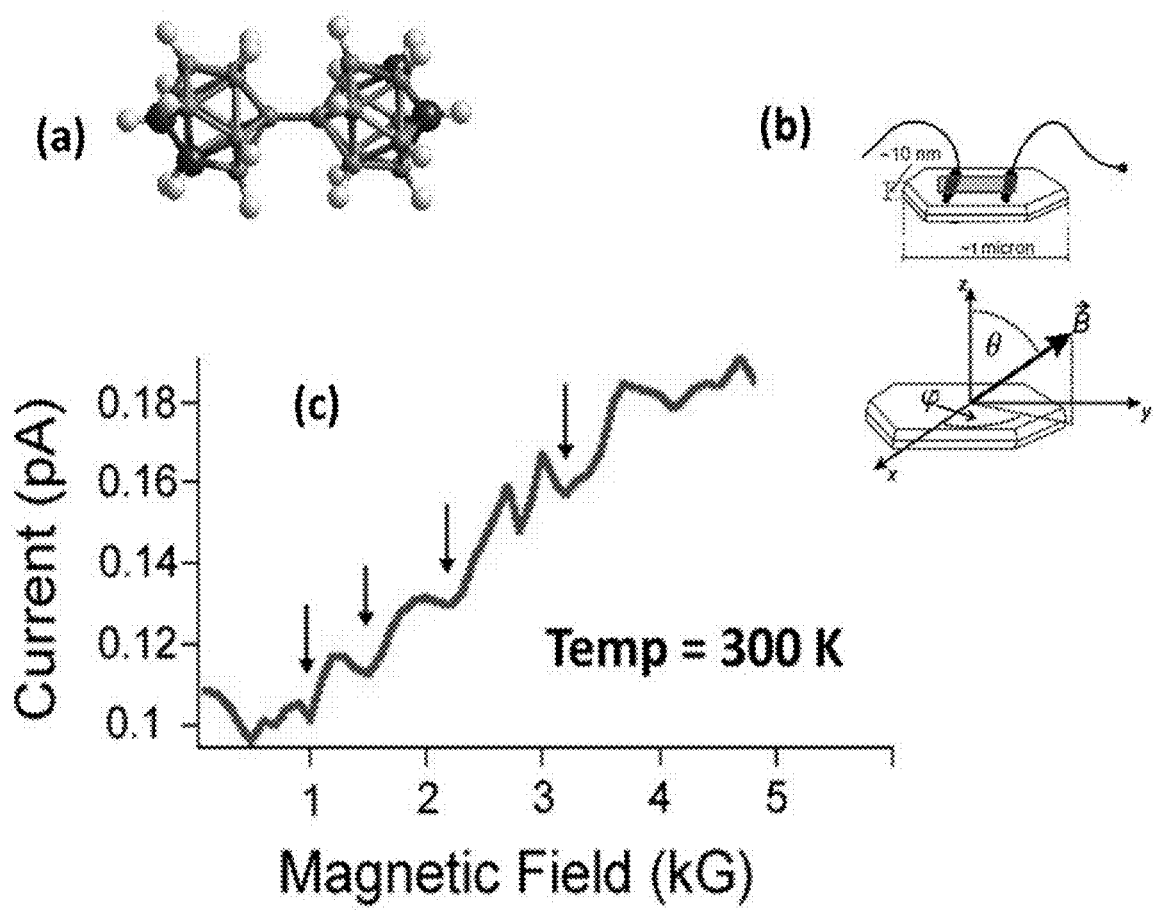
FIG. 5 gives the room temperature magnetoresistance in $B_{10}C_2H_x$: (a) structure of the material, (b) schematic of same preparation and external applied magnetic field, (c) current as a function of applied magnetic field, at room temperature. Arrows mark reproducible features in the data.

The data in FIG. 5 indicate ~80% increase in current as the magnetic field is increased from 0 to 5 kG. A similar magnitude is observed for $B_{10}C_2H_x$:DAB, but with the added feature of hysteresis as a function of the direction of the applied field.

The data in FIG. 5 indicate that application of an external magnetic field creates additional carriers, and that the additional current is due to spin polarized carrier hopping. The reproducible features in the data (FIG. 5, arrows) strongly suggest the population of specific defect states in this material.

Figure 6:
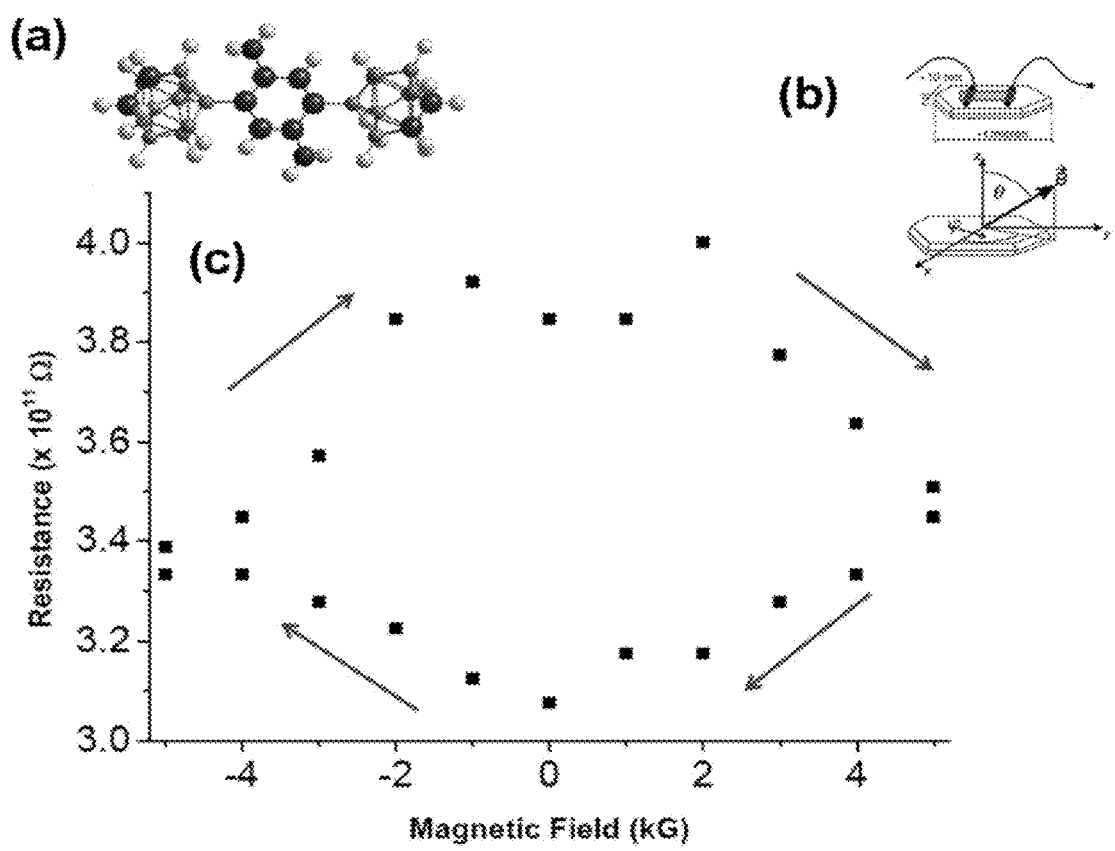
FIG. 6 gives the room temperature magnetoresistance data for $B_{10}C_2H_x$:DAB: (a) structure of the material, (b) schematic of sample preparation and external applied magnetic field, (c) resistance as a function of applied field at constant voltage Red arrows indicate sequence of measurement.

The data in FIG. 6 demonstrate hysteresis in the magnetoresistance of $B_{10}C_2H_x$:DAB. What appears to happen here is that at modest voltages, a spin-polarized current is injected from the permalloy electrodes. As the field increases, the defects become polarized due to trapped spin-polarized charge, and negative magneto-resistance sets in with increased applied magnetic field. As the magnetic field is taken off and reduced, there is blocking that holds the spin polarization in the defects until a substantial reverse applied magnetic field is reached and all the magnetization reverses. Of course, this scenario means that the blocking temperature is well above room temperature, which is highly unusual. Alternatively, is this is a room temperature Hall effect, enhanced by the negative magneto-resistance and the ferroelectric contacts. What is clear that the trapping of spin-polarized charge within the 1,4 diaminobenzene-doped boron carbide, combined with the fact that ultra-thin films can be grown, pin-hole free, indicates that we now have a superlative magnetic tunnel junction barrier.

This newly observed phenomenon provides the basis to both explore the fundamental mechanisms for these phenomena, and to develop practical spintronics and magneto-electronic devices.

Spin-polarized photoemission/inverse photoemission measurements provide polarization of valence and conduction band carriers as a function of applied magnetic field. Additionally, the results for FIG. 6 suggest possible ferromagnetism in $B_{10}C_2H_x$:DAB. This will be explored with magneto-optic Kerr effect (MOKE) and reflectivity measurements designed to probe polarization in the valence and conduction bands.

Figure 7:
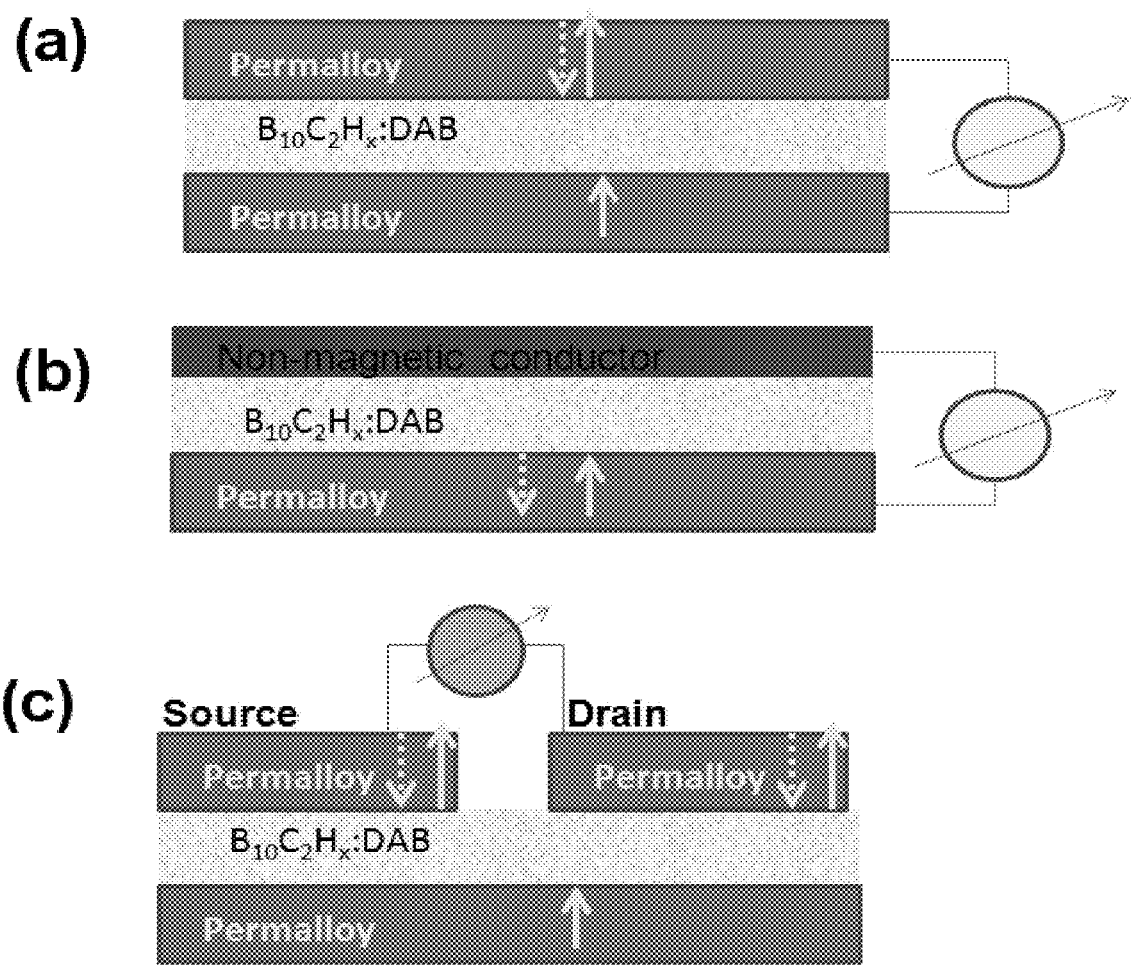
FIG. 7 illustrates three devices that take advantage of the supermagnetoconductance exhibited by the $B_{10}C_2H_x$:DAB alloy polymer of the invention, including (a) a magnetic tunnel junction where the barrier layer may be switched between a polarized and non-polarized state by an applied voltage, (b) a spin-memristor wherein a pulsed magnetic field is used to alter the barrier material conductivity and (c) a non-local spin valve.

Devices such as those in FIG. 7 may be prepared to explore and exploit both magnetic resonance and hysteresis. These include (FIG. 7a) "forming" magnetic tunnel junctions. The $B_{10}C_2H_x$:DAB barrier may be switched between a polarized and non-polarized state by an applied voltage that sweeps out the carriers. The polarized barrier material may act as a "spin amplifier", in which ↑ and ↓, electrons tunneling through the barrier experience distinct barrier heights that differ by an exchange integral, leading to exponential differences in ↑ and ↓ tunneling currents. Importantly, Co/$B_{10}C_2H_x$/Co MTJs have been tested [14] and display tunneling magnetoresistance values of ~50% at room temperature. This is significantly better than commonly available commercial devices, and within a factor of four of (decidedly more manufacturable than) epitaxial Fe(001)/MgO(001)/Fe(001) based devices. The use of $B_{10}C_2H_x$:DAB suggests the possibility of far higher tunneling magnetoresistance values while maintaining the inherent manufacturability of polycrystalline/amorphous materials.

A device similar in structure but different in function is the "spin-memristor (FIG. 7b). In such a device, a pulsed applied magnetic field from the magnetic electrode is used to alter the conductivity of the barrier material (as in FIG. 6), and therefore switching the device between low and high resistance states (LR, HR). The spin memristor structure exploits changes in conductivity and tunneling transmission coefficients in LR and HR states, and could potentially be a simple, highly integrable spin-based unit for NVM and non-volatile logic applications. Finally, non-local spin valves (FIG. 7c) are of interest as an applied magnetic field from the bottom gate and/or forming voltages applied between source and drain could be used to alter the magnetoresistance of the $B_{10}C_2H_x$:DAB channel in a non-volatile manner. This device would be used to probe how combinations of applied voltages and magnetic fields could alter fundamental electronic behavior and device properties.

In addition to formulating $B_{10}C_2H_x$:DAB films, we have succeeded in forming other carborane-based polymers, with carborane icosahedra linked by benzene or by pyridine groups. We have also demonstrated [7,15] that carborane precursors can be doped with transition metals at apex carbon sites, resulting in potential strong metal-metal spin coupling within the carborane unit, and with strong potential as spin filters in devices such as FIG. 7a.

Although the above devices benefit from exploiting the magnetoelectric properties of these materials, they are also practical because they can be fabricated using conventional, low temperature processes, including plasma-based deposition and etch. Recent work in our laboratories has demonstrated that $B_{10}C_2H_x$ can be deposited by Ar-based PECVD, and rapidly etched by $NH_3$ plasma. Similar capabilities for deposition and etch of $B_{10}C_2H_x$:DAB related materials are available.

The display of non-volatile magnetoresistance by $B_{10}C_2H_x$:DAB (FIG. 6) and magnetoresistance by $B_{10}C_2H_x$ (FIG. 5) are more than an order of magnitude greater than in other known B-containing materials, and are manifested at room temperature rather than 4.2 K. Furthermore, these properties are exhibited by materials that are amorphous in nature, rather than epitaxial, with inherent advantages in processing and manufacturability. The fundamental mechanisms responsible for these properties have only begun to be investigated, but already offer considerable potential for the fabrication of spin-based nonvolatile devices. Further, the chemistry in this area is rich, with the possible use of transition-metal doped carborane icosahedra [15] and linking units such as pyridine or benzene. Boron-carbide based polymers must therefore be classified as truly novel electronic/spintronic materials, with exciting properties already manifested, and with more to come.

REFERENCES CITED

[1] S. Hwang, K. Yang, P. A. Dowben, A. A. Ahmad, N. J. Ianno, J. Z. Li, J. Y. Lin, H. X. Jiang, D. N. McIlroy, Appl. Phys. Lett. 70 (1997) 1028.

[2] S. Behera, J. Wilks, P. A. Dowben, J. A. Kelber, Surf. Sci. 604 (2010) L51.

[3] H. Konno, K. Shiba, Y. Kaburagi, Y. Hishiyama, M. Inagaki, Carbon 39 (2001) 1731.

[4] Y. Hishiyama, Y. Kaburagi, K. and Sugihara, Mol. Crystals and Liq. Crystals Sci. and Techn. Section A 340 (2000) 337.

[5] R. S. Singh, x. Wang, W. Chen, Ariando, A. T. S. Wee, Appl. Phys. Lett. 101 (2012) 183105.

[6] P. A. Dowben, O. Kizikaya, J. Liu, B. Montag, K. Nelson, I. Sabirianov, J. I. Brand, Mat. Lett. 63 (2009) 72.

[7] G. Luo, J. Lu, J. Liu, W. Mein, P. A. Dowben, Mat. Sci. and Eng. B 175 (2010) 1.

[8] S. Lee, J. Mazurowski, G. Ramseyer, P. A. Dowben, J. Appl. Phys. 72 (1992) 4925.

[9] D. Byun, B. R. Spady, N. J. Ianno, P. A. Dowben, Nanstruct. Mat. 5 (1995) 465.

[10] F. K. Perkins, R. A. Rosenberg, S. Lee, P. A. Dowben, J. Appl. Phys. 69 (1991) 4103.

[11] F. Pasquale and J. Kelber, Appl. Surf Sci. 258 (2012) 2639.

[12] F. Pasquale L., J. Liu, P. A. Dowben, J. A. Kelber, Mat. Chem. and Phys. 133 (2012) 901.

[13] P. A. Dowben, D. LaGraffe, D. Li, A. Miller, L. Zhang, L. Dottl, M. Onellion, Phys. Rev. B 43 (1991) 3171.

[14] L. Bernard, J. Monson, A. Sokolov, Z. Liu, C.-. Yang, P. A. Dowben, B. Doudin, A. Harken, P. Welsch, B. W. Robetson, Appl. Phys. Lett. 83 (2003) 3743.

[15] J. Liu, G. Luo, W. Mei, O. Kizilkaya, E. D. Shepherd, J. I. Brand, P. A. Dowben, J. Phys. D.s D: Appl. Phys. 43 (2010) 085403.

What is claimed is:

1. A composition of matter comprised of a boron carbide polymer which polymer is comprised of orthocarborane icosahedra cross-linked with a moiety A;
    wherein A is selected from the group consisting of benzene, pyridine, 1,4-diaminobenzene and mixtures thereof; and
    wherein said polymer exhibits a positive magnetoresistance effect of about 30%-80% at room temperature.

2. The composition of matter of claim 1, wherein said polymer is doped with a transition metal at apex carbon sites in said polymer.

3. The composition of matter of claim 1, wherein said polymer is deposited as an amorphous film on a substrate by plasma vapor deposition, chemical vapor deposition, plasma enhanced chemical vapor deposition or by co-condensation of orthocarborane and a moiety A;
    wherein A is selected from the group consisting of benzene, pyridine and 1,4-diaminobenzene.

4. A magnetic tunnel junction comprising a barrier layer which is comprised of the composition of matter of claim 1 which barrier layer may be switched between a polarized and non-polarized state under an applied voltage.

5. A spin-memristor comprising a barrier material comprised of the composition of matter of claim 1, wherein said barrier material exhibits a change in conductivity in response to a pulsed applied magnetic field, whereby said spin-memristor switches between states of low and high resistance.

6. A non-local spin valve comprising a channel of the composition of matter of claim 1.

* * * * *